(12) United States Patent
Walling et al.

(10) Patent No.: US 11,258,410 B2
(45) Date of Patent: Feb. 22, 2022

(54) APPARATUSES AND METHODS FOR HYBRID SWITCHED CAPACITOR ARRAY POWER AMPLIFIERS

(71) Applicant: UNIVERSITY OF UTAH RESEARCH FOUNDATION, Salt Lake City, UT (US)

(72) Inventors: Jeffrey Walling, Salt Lake City, UT (US); Ali Azam, Salt Lake City, UT (US); Zhidong Bai, Salt Lake City, UT (US)

(73) Assignee: UNIVERSITY OF UTAH RESEARCH FOUNDATION, Salt Lake City, UT (US)

( * ) Notice: Subject to any disclaimer, the term of this patent is extended or adjusted under 35 U.S.C. 154(b) by 40 days.

(21) Appl. No.: 16/528,956

(22) Filed: Aug. 1, 2019

(65) Prior Publication Data

US 2020/0044615 A1    Feb. 6, 2020

Related U.S. Application Data

(60) Provisional application No. 62/714,630, filed on Aug. 3, 2018.

(51) Int. Cl.
| | | |
|---|---|---|
| *H03F 3/45* | (2006.01) | |
| *H03F 3/00* | (2006.01) | |
| *H03F 1/56* | (2006.01) | |
| *H03F 3/24* | (2006.01) | |
| *H04B 1/04* | (2006.01) | |

(52) U.S. Cl.
CPC ............ *H03F 3/005* (2013.01); *H03F 1/565* (2013.01); *H03F 3/24* (2013.01); *H04B 1/0475* (2013.01); *H03F 2200/331* (2013.01); *H03F 2200/387* (2013.01); *H03F 2200/451* (2013.01); *H04B 2001/0408* (2013.01)

(58) Field of Classification Search
CPC ........................................................ H03F 3/45
USPC ................................................... 330/9, 252
See application file for complete search history.

(56) References Cited

U.S. PATENT DOCUMENTS

| | | | | |
|---|---|---|---|---|
| 5,712,635 | A | * | 1/1998 | Wilson ................... H03H 17/06 341/123 |
| 6,081,218 | A | | 6/2000 | Ju et al. |

(Continued)

FOREIGN PATENT DOCUMENTS

EP         2579463 A1    4/2013

OTHER PUBLICATIONS

U.S. Appl. No. 62/714,630, filed Aug. 3, 2018.

(Continued)

*Primary Examiner* — Henry Choe
(74) *Attorney, Agent, or Firm* — Dorsey & Whitney LLP

(57) ABSTRACT

Embodiments of the disclosure are drawn to apparatuses a hybrid switched capacitor array power amplifier (H-SCPA). The H-SCPA may have an array of storage elements divided into sub-arrays. A first sub-array may be configured to receive a delta sigma modulated (DSM) signal. A second sub-array may be configured to receive a Nyquist-rate signal. The H-SCPA may provide an output based on the received DSM and Nyquist-rate signals. The first sub-array and second sub-array may have different architectures. The DSM signal may represent the least significant bits of the signal and the Nyquist-rate signal may represent the most significant bits of the signal.

19 Claims, 7 Drawing Sheets

(56) References Cited

U.S. PATENT DOCUMENTS

| | | | |
|---|---|---|---|
| 6,738,006 | B1 | 5/2004 | Mercer et al. |
| 7,504,977 | B2 | 3/2009 | Doorenbos et al. |
| 8,547,177 | B1 | 10/2013 | Yoo et al. |
| 9,520,906 | B2* | 12/2016 | Butterfield .............. H03F 3/211 |
| 9,584,164 | B1* | 2/2017 | Sheikh ................. H04B 1/0042 |
| 9,584,177 | B2 | 2/2017 | Pavlovic et al. |
| 9,800,452 | B2 | 10/2017 | Lehtinen |
| 9,912,348 | B1 | 3/2018 | Baringer et al. |
| 2002/0105451 | A1* | 8/2002 | Gulati ................... H03M 1/007 341/144 |
| 2016/0191029 | A1* | 6/2016 | Shuvalov ........... H03K 5/00006 327/291 |

OTHER PUBLICATIONS

Bai, et al., "A 12 Bit Split-Array Switched Capacitor Power Amplifier in 130nm CMOS", Proc. of IEEE SOC Conf., pp. 1-4.

Bai, et al., "A split-array, C-2C switched-capacitor power amplifier in 65nm CMOS", Digest of Papers—IEEE Radio Frequency Integrated Circuits Symposium, 2017.

Bai, et al., "Split-Array, C-2C Switched-Capacitor Power Amplifiers", IEEE Journal of Solid-State Circuits, 2018, pp. 1-12.

Balasubramaniam, et al., "12-bit Hybrid C2C DAC based SAR ADC with Floating Voltage Shield", International Conference on Signals, Circuits and Systems, 2009, pp. 1-5.

Frenzel, "High-Speed RF Sampling ADC Boosts Bandwidth, Dynamic Range", https://www.electronicdesign.com/adc/high-speed-rf-sampling-adc-boosts-bandwidth-dynamic-range, last accessed Aug. 1, 2019, Feb. 22, 2017, 7 pages.

Frenzel, "What's the Difference Between SAR and Delta-Sigma ADCs?", https://www.electronicdesign.com/adc/what-s-difference-between-sar-and-delta-sigma-adcs, last accessed Aug. 1, 2019, May 4, 2016, 8 pages.

Su, et al., "A 12 bit 1 GS/s Dual-Rate Hybrid DAC With an 8 GS/s Unrolled Pipeline Delta-Sigma Modulator Achieving > 75 dB SFDR Over the Nyquist Band", IEEE J. Solid-State Circuits, vol. 50, Apr. 2015, pp. 896-907.

Vorapipat, et al., "A Class-G Voltage-Mode Doherty Power Amplifier", IEEE J. Solid-State Circuits, vol. 52, No. 12, Dec. 2017, pp. 3348-3360.

Ye, et al., "Design considerations for a direct digitally modulated WLAN transmitter with integrated phase path and dynamic impedance modulation", IEEE J. Solid-State Circuits, vol. 48, Dec. 2013, pp. 3160-3177.

Yoo, et al., "A switched-capacitor power amplifier for EER/polar transmitters", IEEE ISSCC Dig. Tech. Papers, 2011, pp. 428-430.

Yoo, et al., "A switched-capacitor RF power amplifier", IEEE J. Solid-State Circuits, vol. 46, Dec. 2011, pp. 2977-2987.

* cited by examiner

APPARATUSES AND METHODS FOR HYBRID SWITCHED CAPACITOR ARRAY POWER AMPLIFIERS

RELATED APPLICATIONS

This application claims priority to U.S. Provisional Application No. 62/714,630 filed on Aug. 3, 2018, the contents of which are incorporated herein by reference for any purpose.

NOTICE

This invention was made with government support under Grant Number 1508701 awarded by the National Science Foundation. The government has certain rights in the invention.

TECHNICAL FIELD

This disclosure is related to switched capacitor power amplifiers. More specifically, this disclosure relates to segmented switched capacitor power amplifiers.

BACKGROUND

Power amplifiers (PA) have continued to be of interest to radio frequency integrated circuit (RFIC) designers, owing to their dominance in energy consumption in most wireless transceivers. Digital power amplifiers (DPA) have seen growing interest owing to their mixed signal interface that allows them to simultaneously act as a digital-to-analog converter (DAC), frequency up-converter/mixer and power amplifier (PA). This not only provides for significant advantages in energy efficiency, but also allows for significant chip-area savings, as the resulting DPA is actually a band-pass transmitter and does not require large area base-band filtering.

One of the prime challenges with any DPA is that it is a quantized system and its out-of-band (OOB) noise is dominated by signal quantization. Quantization noise is an additive white Gaussian process and hence it exhibits a broad spectrum. Because the quantization noise is broadband, it greatly affects the OOB performance of DPAs and can only be reduced with additional filtering, or with enhanced resolution.

There are two primary modes of operation for DPAs, current-mode DPAs and switched-capacitor power amplifier (SCPA). An example of an SCPA is described in U.S. Pat. No. 8,547,177. In some applications, the SCPA is preferable to current-mode DPAs. For example, SCPAs use capacitors, along with transistors acting as switches, to achieve their linearity. This is advantageous, as deeply scaled CMOS transistors are optimized for their performance as switches and offer low intrinsic gain and output impedances. This allows the SCPA to offer higher linearity and efficiency at higher output power when compared to current-mode DPAs. However, it may be challenging to increase the resolution of an SCPA, owing to the desire to use metal-insulator-metal (MIM) capacitors that can only be divided down to their minimum value, limiting either the resolution of the SCPA, or the quality factor (Q) achievable. Hence, SCPAs may have a tradeoff between higher resolution and achievable quality factor.

SUMMARY

According to embodiments of the disclosure, a hybrid-mode SCPA that segments a traditional SCPA into two segments. A least significant bits (LSB) binary sub-array is modulated using a delta sigma (ΔΣ) modulator (DSM) connected in parallel with a Nyquist-rate unary most significant bits (MSB) array. This provides a hybrid SCPA (H-SCPA) that may achieve a higher bandwidth than a traditional DSM digital-to-analog converter (DAC), while achieving a higher resolution than a traditional Nyquist DAC.

According to an example according to the principles of the present disclosure, a SCPA may include a first sub-array of storage elements configured to be selectively coupled to ground or a voltage source, based at least in part, on a Nyquist-rate signal, wherein the first sub-array outputs a first voltage and a second sub-array of storage elements configured to be selectively coupled to the ground or the voltage source, based at least in part, on a DSM signal, wherein the second sub-array outputs a second voltage, wherein the first voltage and the second voltage are combined to generate an output voltage of the SCPA.

According to an example according to the principles of the present disclosure, an apparatus may include an encoder configured to encode a first portion of a signal and output an encoded signal based on the first portion of the signal, an interpolator configured to oversample a second portion of the signal and output an interpolated signal, a DSM configured to receive the interpolated signal and generate a DSM signal based on the interpolated signal, and a switched capacitor power amplifier SCPA. The SCPA may include a first sub-array of storage elements configured to be selectively coupled to ground or a voltage source based on a first selection signal and output a first voltage, a second sub-array of storage elements configured to be selectively coupled to the ground or the voltage source based on a second selection signal and output a second voltage, and a selection circuit configured to receive the encoded signal and output the first selection signal based, at least in part, on the encoded signal, and receive the DSM signal and output the second selection signal based, at least in part, on the DSM signal. The SCPA is configured to combine the first voltage and the second voltage to generate an output signal.

According to principles of the present disclosure, a method may include receiving a most significant bit (MSB) portion of a digital signal, receiving a least significant bit (LSB) portion of the digital signal, encoding the MSB portion of the signal to generate an encoded signal, delta sigma modulating the LSB portion to generate a delta sigma modulated (DSM) signal, selectively coupling to a voltage source capacitors of a unary sub-array of a switched capacitor power amplifier (SCPA) based, at least in part, on the encoded signal to generate a first output, selectively coupling to the voltage source capacitors of a binary sub-array of the SCPA based, at least in part, on the DSM signal to generate a second output, and combining the first output and the second output to generate an analog signal corresponding to the digital signal.

BRIEF DESCRIPTION OF THE DRAWINGS

FIG. 4 is simulated output power and system efficiency versus frequency for a hybrid Nyquist/delta sigma modulated switched capacitor power amplifier according to principles of the present disclosure.

DETAILED DESCRIPTION

Figure 1:
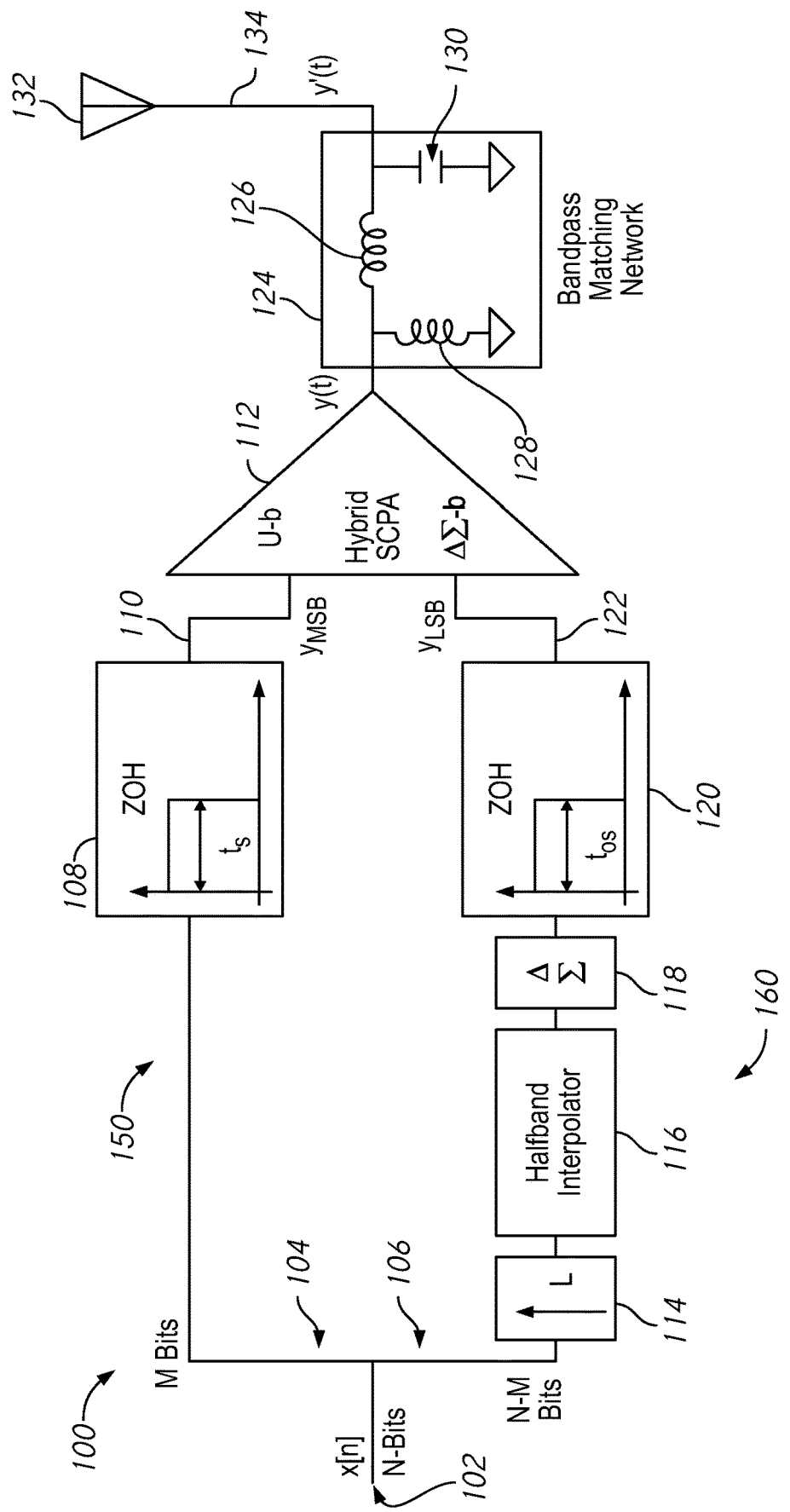
FIG. 1 is a block diagram of an apparatus including a hybrid Nyquist/delta sigma modulated switched capacitor power amplifier according to principles of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

In describing and claiming the present technology, the following terminology will be used. The singular forms "a," "an," and "the" include plural referents unless the context clearly dictates otherwise. As used within, the term "about" is used to provide flexibility and imprecision associated with a given term, metric or value. One skilled in the art can readily determine the degree of flexibility for a particular variable.

As used within with respect to an identified property or circumstance, "substantially" refers to a degree of deviation that is sufficiently small not to measurably detract from the identified property or circumstance. The exact degree of deviation allowable may in some cases depend on the specific context.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

A DAC may place a Nyquist rate DAC in parallel with a delta sigma modulated (DSM) DAC which may improve the resolution/bandwidth paradigm. To increase the resolution of the split capacitor power amplifier (SCPA), split-array digital-to-analog converter (DAC) techniques may be used. A split-array SCPA subdivides the capacitor array into two or more sub-arrays that are split. For example, sub-arrays may be split with an attenuation capacitance, allowing some improvement to the linearity/quality (Q) paradigm. As an extension to the split-array SCPA, an SCPA may include a binary array, rather than a unary array (e.g., an array where all of the capacitors are the same size). An example of a binary array is a C-2C array. In a C-2C array, one capacitor has a first capacitance C and a second capacitance has a second capacitance 2C double the first capacitance. Some binary arrays, such as C-2C arrays, may allow the differences in the minimum and maximum capacitance in the array to be minimized, which may enable improvements in the capacitor matching and hence linearity. However, some binary arrays may not be extended indefinitely because they may incur significant non-linearity at high output resolutions. For example, with C-2C arrays, this may be due to the inter-nodal parasitic in the C-2C topology.

Disclosed herein is a dual-rate hybrid switched capacitor power amplifier that includes multiple sub-arrays. One or more sub-arrays may receive a DSM signal and one or more other sub-arrays may receive a Nyquist signal. The hybrid Nyquist/delta sigma modulated switched capacitor power amplifier may be referred to simply as a hybrid SCPA or H-SCPA. In some examples, the one or more sub-arrays receiving the DSM signal may be a binary array (e.g., C-2C array). In some examples, the one or more sub-arrays receiving the Nyquist signal may be a unary array. An H-SCPA according to the principles of the present disclosure may provide a SCPA with higher resolution and bandwidth than traditional DAC's. The use of a split array with sub-arrays having different topologies (e.g., unary vs. binary) may allow the H-SCPA to achieve the benefits of a binary array while limiting possible non-linear effects at high output resolutions.

FIG. 1 is a block diagram of an apparatus 100 including an H-SCPA 112 according to principles of the present disclosure. The apparatus 100 may implement a dual-rate hybrid DAC in some examples. The apparatus 100 may receive a digital signal x[n] of N bits via an input signal line 102. The most significant bits (MSB) M bits of the signal x[n] may be provided by a first signal line 104 and the leas significant bits $(LSB)_N$-M bits may be provided by a second signal line 106. The MSB (M bits) may pass through a zero-order hold (ZOH) reconstruction 108 (where ts is the Nyquist sampling rate) and the resulting signal YMSB may be provided by signal line 110 to a Nyquist portion (U-b) of the H-SCPA 112. In some examples, as will be described in more detail with reference to FIG. 2, the YMSB may be an encoded signal. In some examples, the Nyquist portion of the H-SCPA 112 may be a unary array. The LSB (N-M bits) may be upsampled 114 and interpolated by an interpolator 116. Although the interpolator 116 shown in FIG. 1 is a half-band interpolator, other interpolators may be used in other examples. The interpolated signal may be modulated by DSM 118 and pass through a ZOH reconstruction 120 (where tos is the oversampling rate). The resulting signal YLSB may be provided by signal line 122 to a DSM (ΔΣ-b) portion of the H-SCPA 112. In some examples, the DSM portion of the H-SCPA 112 may be a binary array, such as a C-2C array.

The H-SCPA 112 may recombine the MSB and LSB components of the digital signal x[n] and output a corresponding analog signal y(t) as will be described in more detail with reference to FIG. 2. Briefly, the H-SCPA 112 may selectively couple individual storage elements (e.g., capacitors) in the sub-arrays to either ground or a voltage source based on the YMSB and YLSB signals. In some examples, analog signal y(t) may be an amplified analog signal corresponding to x[n]. In some examples, the analog signal y(t) may be provided to a bandpass matching network 124. In some examples, the bandpass matching network 124 may be coupled to an antenna 132. The bandpass matching network 124 may filter the analog signal y(t) and output filtered signal y'(t) to signal line 134. The bandpass matching network 124 may drive the antenna 132 in some examples. The antenna 132 may transmit the filtered signal y'(t). In the example shown in FIG. 1, the bandpass matching network includes a first inductor 126 coupled in series with the H-SCPA 112, a second inductor 128 coupled in series with the HSCPA 112 and ground, and a capacitor 130 coupled in series with the first inductor 126 and ground. However, the bandpass matching network 124 may include different components in different examples. The components included in the bandpass matching network 124 may be based, at least in part, on desired filtering of the analog signal y(t) and/or impedance and/or other properties of the antenna 132. In other examples, the bandpass matching network 124 may be omitted and the antenna 132 may transmit the analog signal y(t). Note, although the apparatus 100 is shown with a single-ended output, in other examples, apparatus 100 may have a differential output.

In summary, the apparatus 100 may receive a most significant bit (MSB) portion of a digital signal, a least significant bit (LSB) portion of the digital signal. The apparatus 100 may encode the MSB portion of the signal to generate an encoded signal and perform delta sigma modulation on the LSB portion to generate a delta sigma modulated (DSM) signal. The H-SCPA may selectively couple to a voltage source capacitors of a unary sub-array based, at least in part, on the encoded signal to generate a first output and selectively couple to the voltage source capacitors of a binary sub-array based, at least in part, on the DSM signal to generate a second output. The H-SCPA may combine the first output and the second output to generate an analog signal corresponding to the digital signal.

As shown in FIG. 1, the architecture of a dual-rate hybrid DAC may include a Nyquist rate MSB path 150 and an oversampled delta sigma modulated LSB 160 path to provide inputs to an H-SCPA 112. In some examples, the output analog signal y(t) of the H-SCPA 112 may be a high-speed dithered signal that is embedded on the low-speed, low-resolution Nyquist rate signal. The DSM in the LSB path may compress the bit width of the input signal, which may reduce the overall number of switched-capacitor cells needed in the H-SCPA 112. This may reduce the impact of non-idealities in the switched capacitor array (e.g., capacitor mismatch) in some examples. This may allow for reduced time in design cycles to mitigate the non-idealities. In some examples, the analog layout may be more compact, since a reduced number of cells may be required to achieve a desired output resolution.

As mentioned previously, the array of capacitors of the H-SCPA is divided into sub-arrays. The different sub-arrays receive different portions of the signal x[n] (e.g., one sub-array receives MSBs and the other sub-array receives the LSBs). When designing an H-SCPA, how to partition the segmentation of oversampled LSBs and Nyquist-rate MSBs should be determined. In some examples, the segmentation ratio, r, may be defined by the following equation:

$$r = \frac{2^N - 2^{N-M}}{2^N - 1}, \quad (1)$$

where N is the total number of bits of the array, and M are the number of MSBs.

Factors to consider when segmenting may be the desired bandwidth and/or linearity of the DAC. The bandwidth, BW, of the DAC may be given by the following equation:

$$BW \approx \frac{f_{OS}}{\pi} \sin^{-1}\left\{10^{-\frac{3\log_2[2^N - r(2^N - 1)]}{10k}}\right\}, \quad (2)$$

where $f_{os}$ is the oversampling rate of the DSM, and k is the order of the noise shaper in the DSM.

To determine the achievable linearity of the DAC, Simulink models may be used to compare segmented H-SCPAs to conventional SCPAs (e.g., unary or binary arrays). However, other modeling methods or validation techniques may be used. A metric that may be used for choosing an overall resolution for SCPAs is the level of out-of-band (OOB) noise of the quantized signal. It has been demonstrated that in some applications, an overall resolution of 9b leads to acceptable levels of OOB noise in digital power amplifiers (PAs). Hence, an example H-SCPA described herein with reference to FIG. 2 is designed to achieve an effective number of bits (ENOB)≥9b.

In an example H-SCPA according to principles of the present disclosure, a 12b design with a target bandwidth of 50 MHz may meet the bandwidth and linearity requirements for a 20 MHz, 64 quadrature amplitude modulation (QAM) orthogonal frequency division multiplexing (OFDM) signal (e.g., Wi-Fi and LTE). Simulink and SPICE simulations demonstrate that a segmentation of N-M=8 (e.g., the LSB path) and M=4 (e.g., the MSB path) allow for the required BW and linearity requirements to be satisfied. Segmenting the array and performing DSM on the LSB path as described herein may result in reduced OOB noise when compared to purely DSM systems, which may be due to the reduced signal energy in the LSB DSM path.

Figure 2:
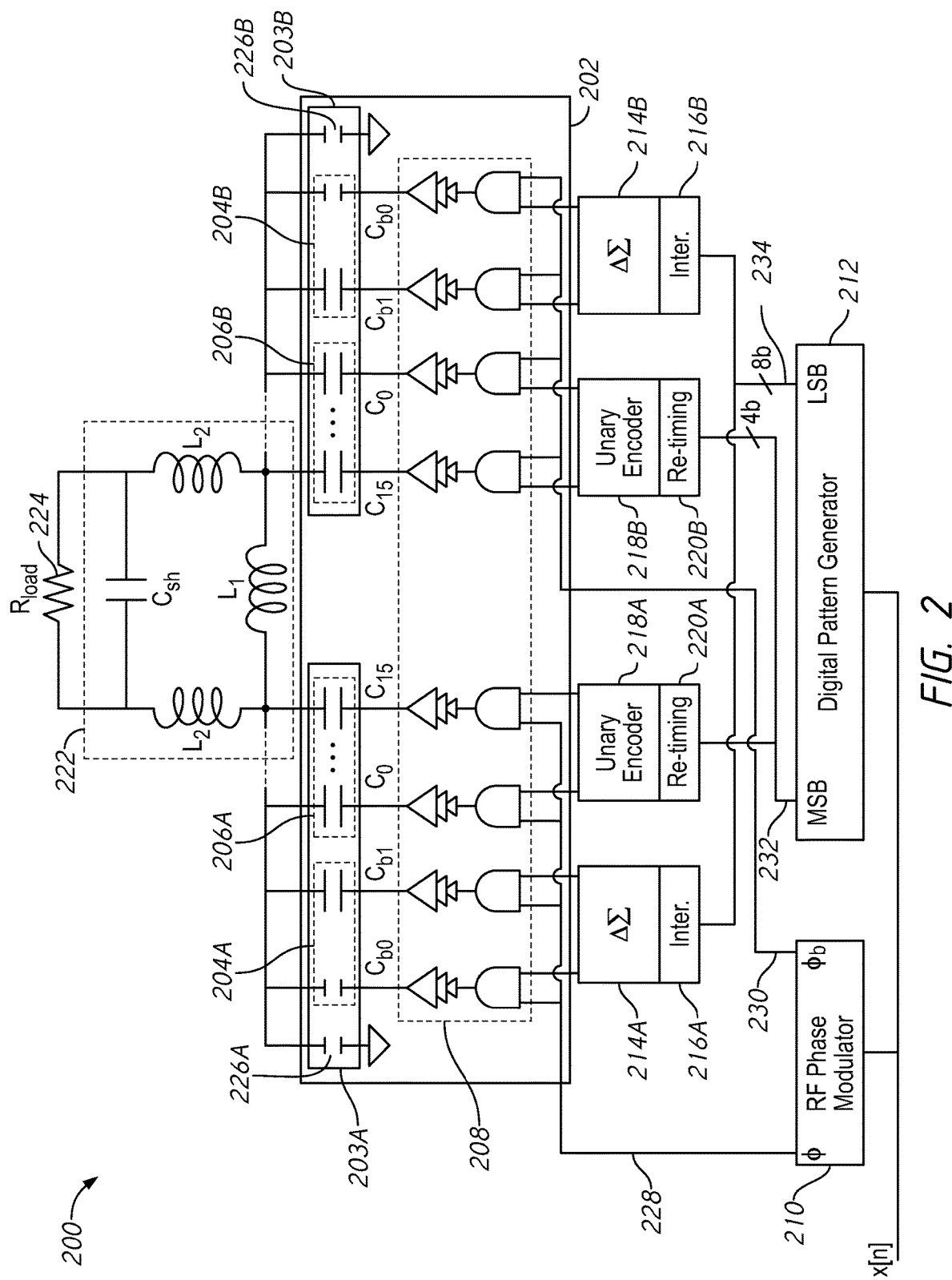
FIG. 2 is a diagram of an apparatus including a hybrid Nyquist/delta sigma modulated switched capacitor power amplifier with a differential output according to principles of the present disclosure.

FIG. 2 is a diagram of an apparatus 200 including an H-SCPA 202 with a differential output according to principles of the present disclosure. Because the apparatus 200 has a differential output, there are two identical arrays 203A-B in the H-SCPA 202 and identical circuitry to provide inputs to the HSCPA 202. However, apparatus 200 could be modified to have a single-ended output similar to apparatus 100 shown in FIG. 1.

The H-SCPA 202 may include an array 203A-B of storage elements divided into sub-arrays 204A-B, 206A-B. The sub-arrays 204A-B, 206A-B may be coupled in parallel in some examples. In the example shown in FIG. 2, the storage elements are capacitors $C_{0-15}$ and $C_{b0-b1}$. Sub-arrays 204A-B may be binary C-2C arrays in some examples. That is, the capacitance of Cm may be double the capacitance of $C_{b0}$. However, other binary array topologies may be used in other examples. Sub-arrays 206A-B may be unary arrays. That is, the capacitance of capacitors $C_{0-15}$ may all be the same. The H-SCPA 202 may further include a selection circuit 208. The selection circuit 208 may selectively couple the capacitors $C_{0-15}$ and $C_{b0-b1}$ to ground or one or more voltage sources by selection signals based on an input signal x[n], as will be described in more detail below. For simplicity, ground and the one or more voltage sources coupled to the capacitors are not shown in FIG. 2. Although the selection circuit 208 is shown as including a plurality of AND logic and inverters (e.g., level shifters) in the example shown in FIG. 2, any suitable logic to selectively couple the capacitors may be used.

SCPAs may be considered special cases of class-D PAs that operate in the voltage domain. Class-D PAs include a switched series resonant RLC filter, where the inductor, L, and the capacitor, C, are tuned to the switching frequency and serve to select the fundamental harmonic of the input switching waveform for output to an antenna. Linearity in an SCPA may be achieved by segmenting the capacitor, C, into N unit capacitors (Cu) to form an array of capacitors 203A-B that share a common top-plate. For example, capacitors $C_{0-15}$ and $C_{b0-b1}$ may share a common top-plate. In some examples, the bottom plate of each capacitor may be driven by an inverter (which in some examples may act as a level shifter) of the selection circuit 208 that acts as a switch between a supply voltage ($V_{DD}$) and ground. Each switch may be selectable using digital logic functions that gate a clock signal with an enable signal. As shown in the example of FIG. 2, the digital logic is implemented as an AND gate. By precisely controlling the number of capacitors that are coupled to $V_{DD}$, n, and those that are held at ground, N-n, a charge division can be created that allows for a linear quantized output voltage to be produced. The input received by the selection circuit 208 that determines a particular combination of capacitors coupled to $V_{DD}$ and capacitors coupled to ground may be referred to as a code word. That is, different code words may correspond to different output voltages produced by the capacitor array 203A-B.

In the example shown in FIG. 2, the capacitor array 203A-B is divided into two sub-arrays. Sub-array 206A-B includes 15 unary capacitors $C_{0-15}$ and sub-array 204A-B includes two binary weighted capacitors $C_{b0-b1}$. These sub-arrays are provided only as an example and the capacitor array 203A-B of the H-SCPA 202 could be divided in a different manner in other examples without departing from the principles of the present disclosure. In some examples, the binary weighted capacitor $C_{b1}$ may have an equivalent capacitance to one of the unary array unit capacitors $C_{0-15}$ and the binary weighted capacitor $C_{b0}$ may have a capacitance equivalent to half that value. In some applications, this may compensate for saturation of a DSM 214, described in more detail below. In some examples, the unary capacitors $C_{0-15}$ and binary weighted capacitor $C_{b1}$ may have a value of 144 fF and the binary weighted capacitor $C_{b0}$ may have a value of 72 fF. In some examples, dummy capacitors 226A-B may be added in parallel with the binary sub-arrays 204A-B. In some applications, this may balance the charge of the binary weighted capacitors. In some examples the dummy capacitors 226A-B may have values of 72 fF. The capacitance values are provided only as examples and the capacitors may have different values in other examples.

The output voltage, $V_{out}$, at the top plate of the capacitor array can be shown to be given by the following equation:

$$V_{out} = \frac{2n}{\pi N} V_{DD}. \quad (3)$$

From this, the output power, $P_{out}$, is given by the following equation:

$$P_{out} = \frac{V_{out}^2}{R_{opt}} = \frac{2}{\pi^2} \left(\frac{n}{N}\right)^2 \frac{V_{DD}^2}{R_{opt}}, \quad (4)$$

Where $R_{opt}$ is the optimum termination impedance required to achieve the desired output power.

In some examples, the output of the H-SCPA may be provided to a matching network 222. In the example shown in FIG. 2, the matching network may include an inductor $L_1$ between the differential outputs and inductors L2 coupled in parallel between the inductor $L_1$ and a shunt capacitor $C_{sh}$. The matching network 222 can be used to synthesize an impedance $R_{opt}+jL_{opt}$ from the load 224 (e.g., $R_{load}$) to be presented to the capacitor array to achieve the desired resonance and output power. $L_{opt}$ may be chosen to resonate with the total capacitance in the array at the desired operating frequency. Although shown as a resistor in FIG. 2, the load 224 may be an antenna in some examples.

In some examples, the H-SCPA 202 output stage may be a cascoded inverter. In some examples, the cascoded inverter may operate from a 2.4 V power supply. The H-SCPA 202 may be designed to achieve an output power of 250 mW, and may operate differentially, which may result in an equivalent $R_{opt}$=18.7Ω The total capacitance of the array may be chosen by the desired network quality factor ($Q_{NW}$). For example, if $Q_{NW}$ is approximately 2, then the total capacitance may be 2.3 pF. In some examples, the matching network may transform a 100 Ohm differential output impedance to a required optimal termination impedance using inductors $L_1$=3 nH, $L_2$=720 pH and a shunt capacitor, $C_{sh}$=32 fF. These values are provided for exemplary purposes only and the principles of the present disclosure are not limited to the particular values disclosed.

The apparatus 200 may include a radio frequency (RF) phase modulator 210 and a digital pattern generator 212 that receive an input digital signal x[n]. In the example shown in FIG. 2, x[n] is a 12b signal. However, this is for exemplary purposes only, and the signal x[n] may be more or fewer bits in other examples. The RF phase modulator 210 may extract the phase information from the digital signal x[n] and provide a clock signal ($\phi$, $\phi_b$) based on the phase information of the digital signal x[n]. In some examples, the clock signal is a differential clock signal. In some examples, the RF phase modulator 210 may include a low-voltage differential signaling clock receiver and distributed to the selection circuit 208 through a differential clock driving chain to the H-SCPA 202 via clock signal lines 228 and 230. In some examples, the clock signal may be used to drive the selection circuit 208 at a frequency or carrier frequency of the signal x[n].

The digital pattern generator 212 may extract the amplitude information from the digital signal x[n] and output the MSB portion of the signal x[n] and the LSB portion of the signal x[n] on separate signal lines 232 and 234, respectively. In the example shown in FIG. 2, the MSB portion includes 4b and the LSB portion includes 8b. However, the MSB and LSB portions may include different numbers of bits in other examples. In some examples, all internal operations are 12b sign extended, which may prevent improper overflows.

The LSB portion may be provided to interpolators 216A-B and oversampled. In some examples, the interpolators 216A-B may include synthesized half-band filters. However, other interpolating techniques may be used. The oversampled signals may then be provided to DSMs 214A-B. The DSMs 214A-B may take the 8b LSB input and output two DSM bits. The output bits of the DSMs 214A-B may be provided to the portion of the selection circuit 208 that controls sub-arrays 204A-B of the H-SCPA 202, which may be binary arrays, as discussed previously. In other examples, the DSMs 214A-B may output more than two bits when the binary array includes more than two capacitors and/or there are multiple binary arrays. The selection circuit 208 may selectively couple capacitors of sub-arrays 204A-B to either ground or the voltage source based on the output of the DSMs 214A-B. Thus, the example shown in FIG. 2, the sub-arrays 204A-B may be controlled by the LSB portion of x[n] (e.g., 8b).

In some examples, the MSB portion may be provided to re-timing circuits 220A-B. The re-timing circuits 220A-B may be achieved in synthesis to synchronize the MSB and LSB output bits before they are input to the H-SCPA 202 since the MSB portion may only be sampled at the Nyquist rate in some examples. In some examples, the re-timing circuits 220A-B may include delays, loops, and/or other appropriate synchronization circuit components. The re-timed MSB portion may be provided to encoders 218A-B. Although the example in FIG. 2 is a unary encoder, other encoding schemes may be used (e.g., binary encoding). The output of the encoders 218A-B may be provided to the portion of the selection circuit 208 that controls sub-arrays 206A-B of the H-SCPA 202, which may be unary arrays in some examples. The selection circuit 208 may selectively couple capacitors of sub-arrays 206A-B to either ground or the voltage source based on the output of the encoders 218A-B. Thus, in the example shown in FIG. 2, the sub-arrays 206A-B may be controlled by the MSB portion of x[n] (e.g., 4b).

The apparatus 200 and H-SCPA 202 shown in FIG. 2 is an example implementation of the principles of the present disclosure. The example shown in FIG. 2 is provided merely for illustrative purposes. It should be understood that the principles of the present disclosure are not limited to the particular size of the capacitor array 203A-B, the segmentation of the sub-arrays, the architecture (e.g., unary, binary) of the sub-arrays, number of bits of the signal, and/or division between MSB and LSB described in reference to FIG. 2.

Figure 3:
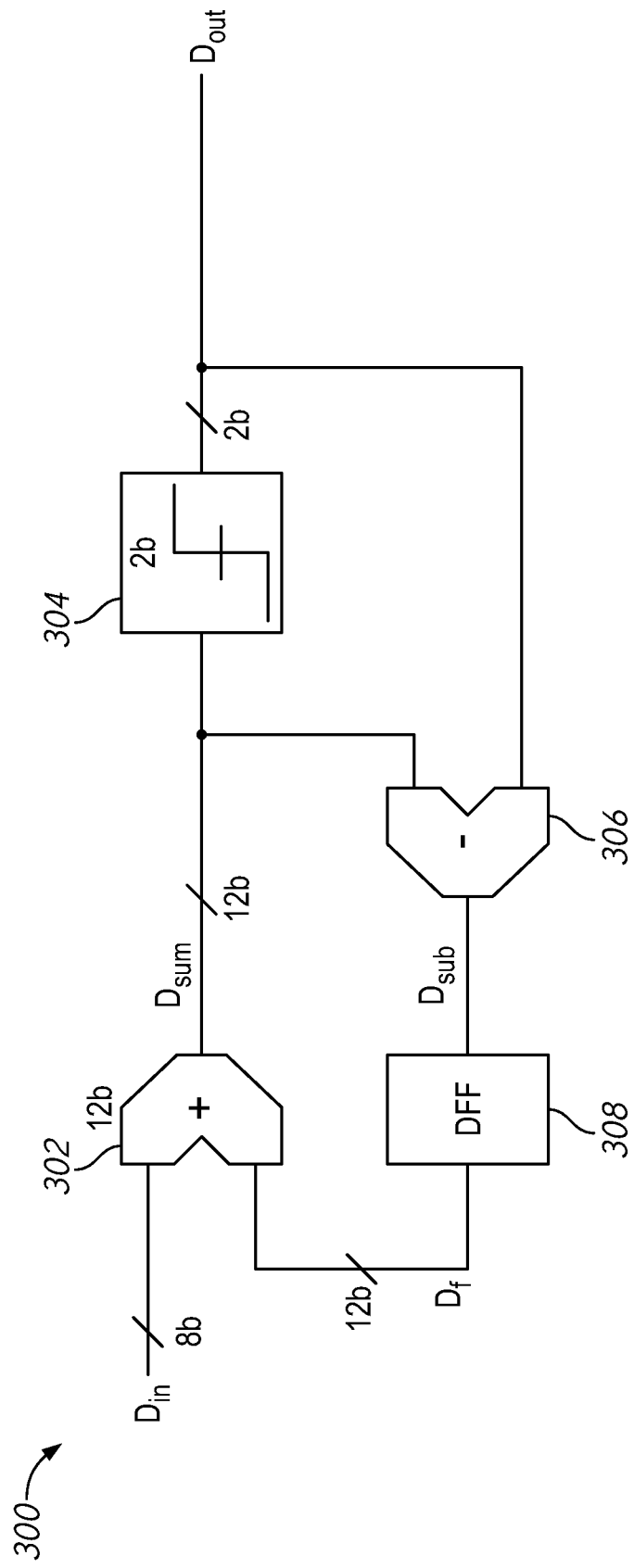
FIG. 3 is a block diagram of a first-order delta sigma modulator according to principles of the present disclosure.

FIG. 3 is a block diagram of a first-order delta sigma modulator (DSM) 300 according to principles of the present disclosure. In some examples, the DSM 300 may be included in the DSM 214A-B shown in FIG. 2. In the example shown in FIG. 3, a first-order DSM noise shaper may be chosen (e.g., k=1). In some applications, this may be desirable since it may be easily designed and synthesized for certain technologies, such as complementary metal oxide semiconductors (CMOS) technology using standard cells (e.g., 65 nm CMOS). The DSM 300 is only an example of a DSM that may be used. Other DSM may be used in other examples. For example, multi-level, multi-bit, and/or multi-order DSM may be used.

The DSM 300 may receive an input signal $D_{in}$. In the example shown in FIG. 3, $D_{in}$ is an 8b signal (e.g., the 8b LSB of the signal x[n] shown in FIG. 2). The input signal $D_{in}$ may be combined with a filtered signal $D_f$ at summing block 302. In the example shown in FIG. 3, $D_f$ is a 12b signal. In some examples summing block 302 may include circuitry for adding signals $D_{in}$ and $D_f$. The combined signal $D_{sum}$ may be provided to a quantizer 304. In the example shown in FIG. 3, quantizer 304 is a 2b quantizer. However, in other examples, the quantizer 304 may have a different number of bits. The number of bits of the quantizer 304 may be based, at least in part, on a number of capacitors in the DSM sub-array of an H-SCPA, such as H-SCPA 202 shown in FIG. 2. The quantized signal $D_{out}$ may be provided as an output of the DSM 300. In some examples, the output $D_{out}$ may be provided to an H-SCPA as described in reference to FIGS. 1 and 2. The quantized signal $D_{out}$ may also be provided with the combined signal $D_{sum}$ to a comparator block 306. In some examples, the compactor block 306 may include circuitry for determining a difference between the combined signal $D_{sum}$ and the quantized signal $D_{out}$. The comparator block 306 may output the difference between the signals as difference signal $D_{sub}$. In some examples, the difference signal $D_{sub}$ may be provided to a filter 308, which may output filtered signal $D_f$. In the example shown in FIG. 3, the filter may be a discrete Fourier filter. However, other filters may be used.

Figure 4:
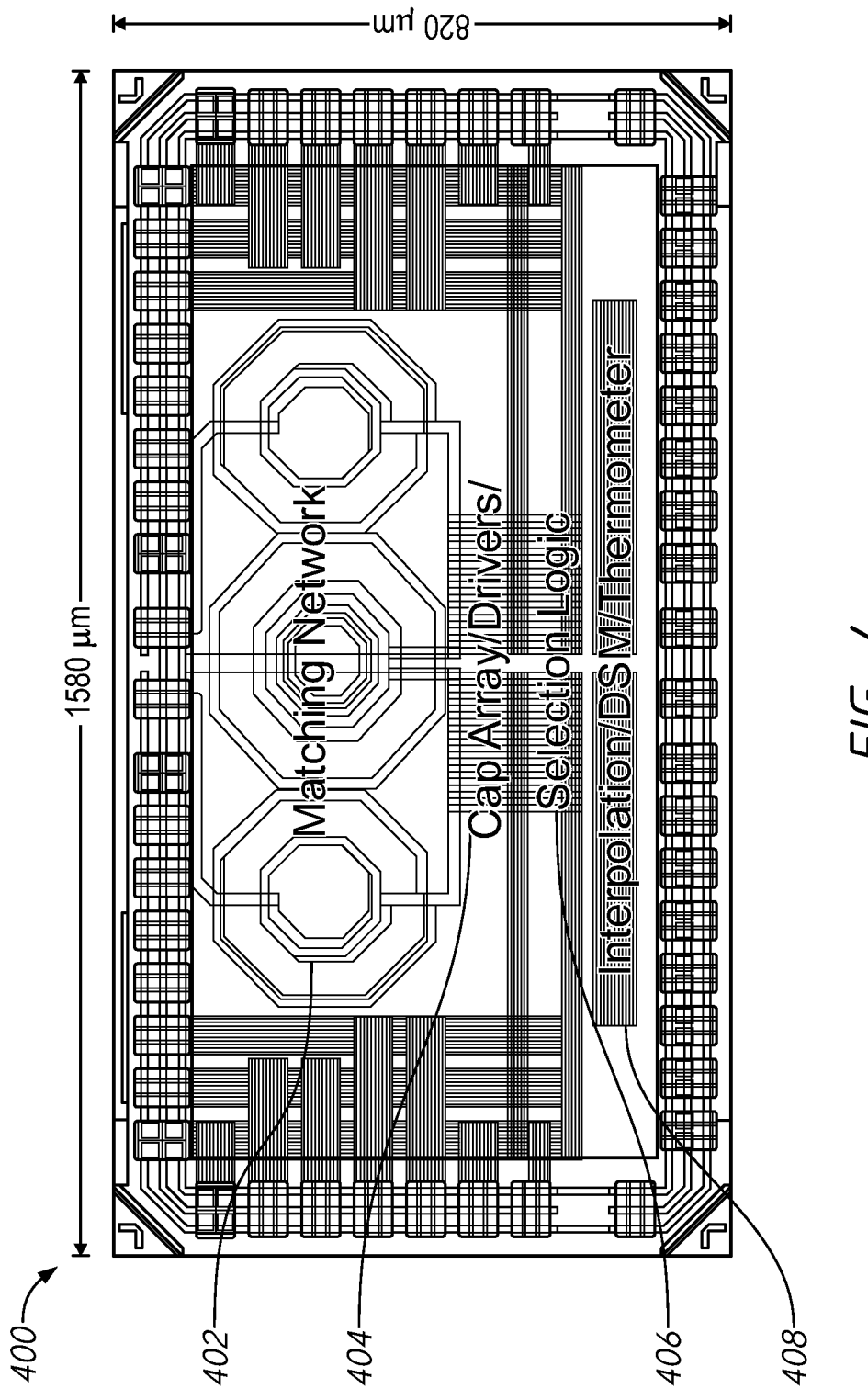
FIG. 4 is an example chip layout of an apparatus including a hybrid Nyquist/delta sigma modulated switched capacitor power amplifier according to principles of the present disclosure.

FIG. 4 is an example chip 400 layout of an apparatus including an H-SCPA according to principles of the present disclosure. In some examples, the chip 400 may include at least a portion of apparatus 200 shown in FIG. 2. In some examples, the chip 400 may be implemented in a 65 nm RF CMOS process with MIM capacitors and ultra-thick metallization. In the example shown in FIG. 4, the chip dimensions are 1580 μm in length and 820 μm in width. However, other dimensions may be used.

The chip 400 may include a matching network 402. Matching network 402 may include matching network 222 in some examples. The chip 400 may include a capacitor array and drivers for the capacitor array 404 and selection logic circuits 406, which may be used to implement an H-SCPA, such as H-SCPA 202 shown in FIG. 2 in some examples. The chip 400 may include interpolation, DSM, and encoder (e.g., a thermometer encoder) 408, which may be used to implement the interpolators 215A-B, DSM 214A-B, and encoders 218A-B shown in FIG. 2 in some examples. Although not shown in FIG. 4, in some examples, the chip 400 may include an RF modulator, a digital pattern generator and/or an antenna.

As an illustrative example of the operation of an H-SCPA according to principles of the present disclosure, the chip 400 layout shown in FIG. 4 for the example H-SCPA shown in FIG. 2 was extracted for simulating the performance. The design was extracted with full parasitics. The simulated design was analyzed over its input code range and frequency range. The results of the simulations are discussed in reference to FIGS. 5-10. The results are provided merely to demonstrate the operation of one example H-SCPA according to principles of the present disclosure. Other H-SCPA may have different performance characteristics and/or may operate different input code and frequency ranges.

Figure 5:
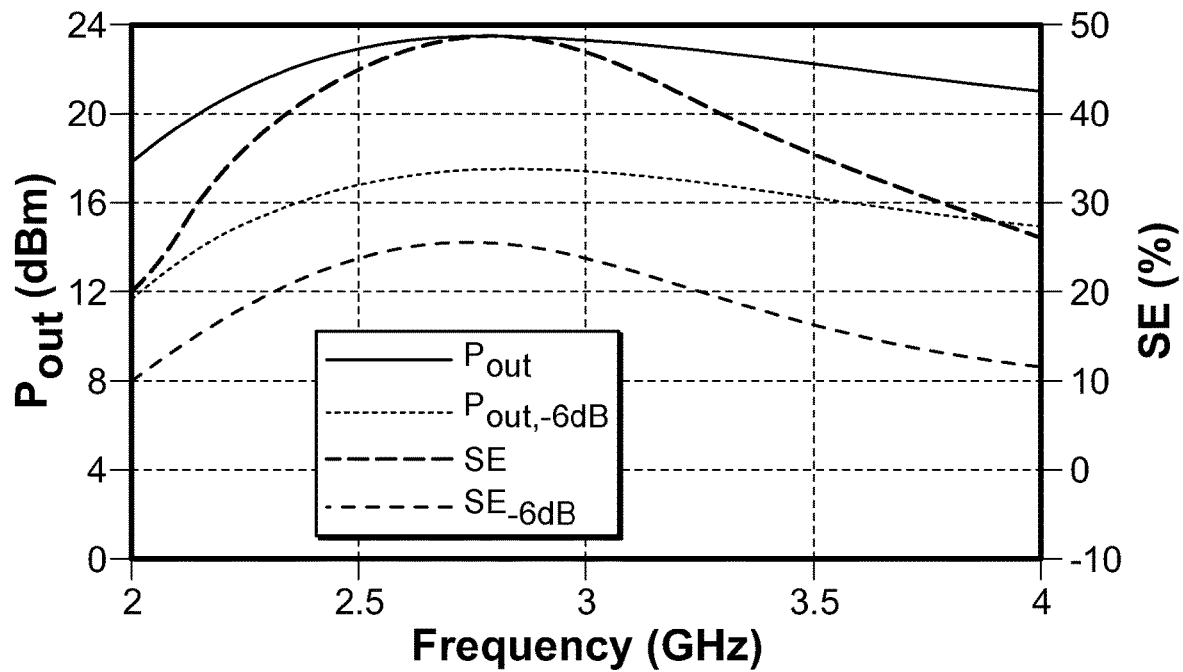
FIG. 5 is simulated integrated non-linearity and differential non-linearity for a hybrid Nyquist/delta sigma modulated switched capacitor power amplifier according to principles of the present disclosure.

FIG. 5 is simulated output power and system efficiency versus frequency for an H-SCPA according to principles of the present disclosure. The performance of the H-SCPA is plotted versus frequency. The H-SCPA achieves peak output power of 23.5 dBm at 2.8 GHz. The system efficiency (SE), which is a ratio of the output power to all DC and RF power input to the chip is 48% at 2.8 GHz. The system has wide efficiency bandwidth, with >30% SE from 2.2-3.6 GHz. Also shown is the output power and efficiency versus frequency when the H-SCPA is operated at −6 dB power backoff.

Figure 6:
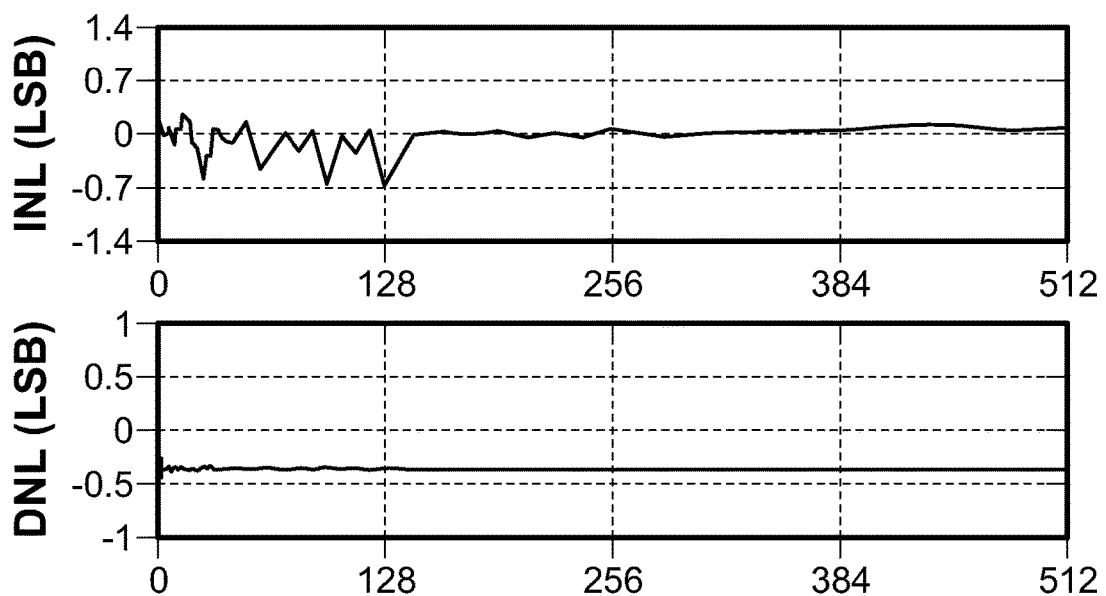
FIG. 6 is simulated system efficiency versus output power at 2.8 GHz for a hybrid Nyquist/delta sigma modulated switched capacitor power amplifier according to principles of the present disclosure.

FIG. 6 is simulated integrated non-linearity (INL) and differential non-linearity (DNL) for a H-SCPA according to principles of the present disclosure. Output voltage characteristic versus input digital code word across the entire 12b input code word range at 2.8 GHz were simulated to illustrate the linearity of the H-SCPA. The simulated integrated non-linearity (INL) and differential non-linearity (DNL) are plotted as functions of the digital code word in FIG. 6. The simulated INL is <±1 LSB and the simulated DNL is <±0.5 LSB at a resolution of 9b. The hybrid approach for the SCPA according to principles of the present disclosure yields an effective number of bits (ENOB) of 9b, which is 3b higher than the designed resolution of the capacitor array, which may validate the resolution enhancement provided by the DSM.

Figure 7:
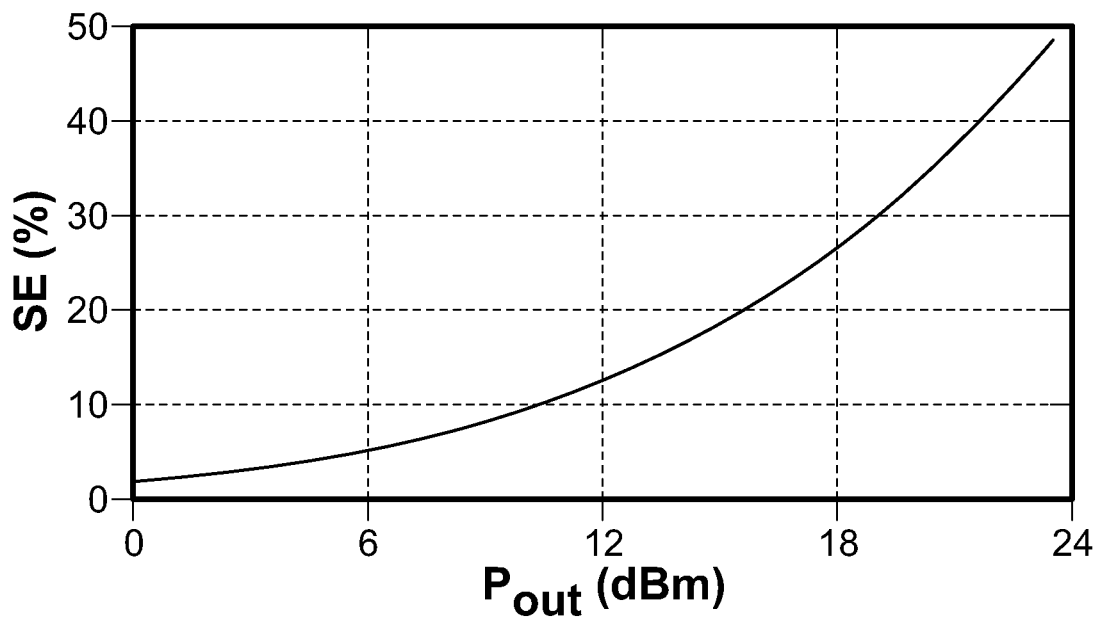
FIG. 7 is simulated output power versus input code word for a hybrid Nyquist/delta sigma modulated switched capacitor power amplifier according to principles of the present disclosure.
Figure 8:
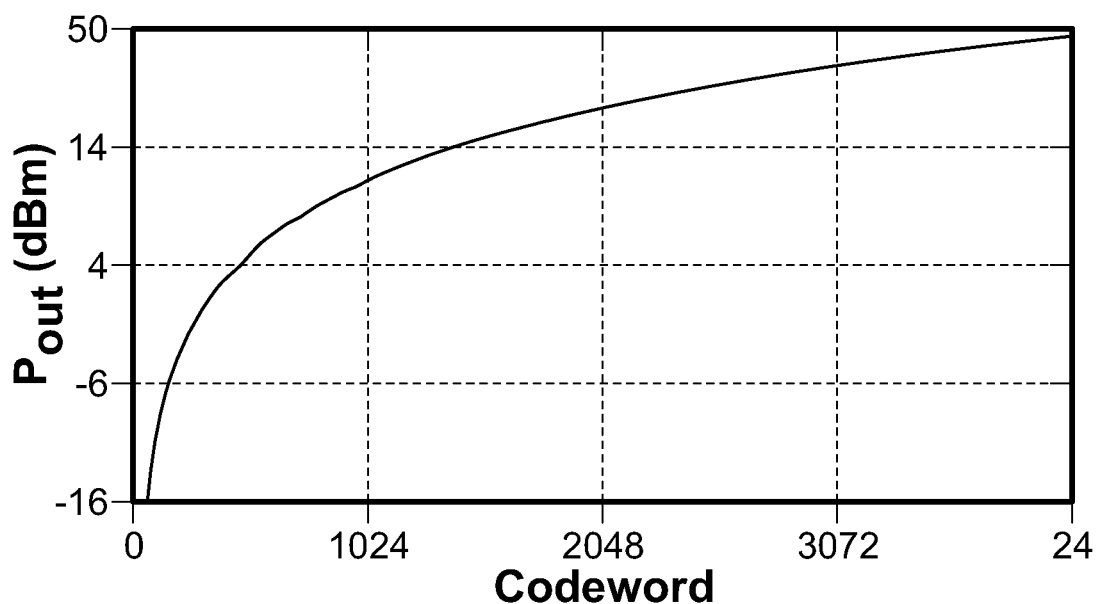
FIG. 8 is simulated power spectral density for a 20 MHz, 64 quadrature amplitude modulation, orthogonal frequency division multiplexing signal for a hybrid Nyquist/delta sigma modulated switched capacitor power amplifier according to principles of the present disclosure.

FIG. 7 is simulated system efficiency versus output power at 2.8 GHz for an H-SCPA according to principles of the present disclosure. FIG. 8 is simulated output power versus input code word for an H-SCPA according to principles of the present disclosure. The results of FIGS. 7 and 8 show that the H-SCPA may achieve similar output power as prior SCPA implementations. The efficiency and/or output power may be at least partially dependent on the design selected for the DSM in some applications.

Figure 9:
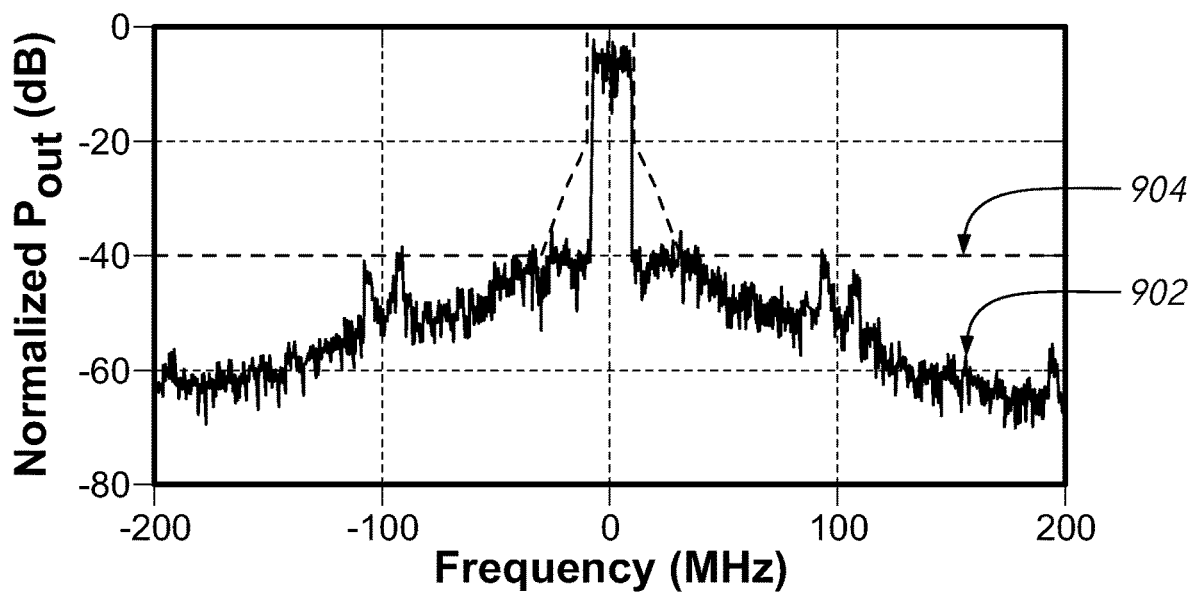
FIG. 9 is a simulated output constellation for a hybrid Nyquist/delta sigma modulated switched capacitor power amplifier according to principles of the present disclosure.
Figure 10:
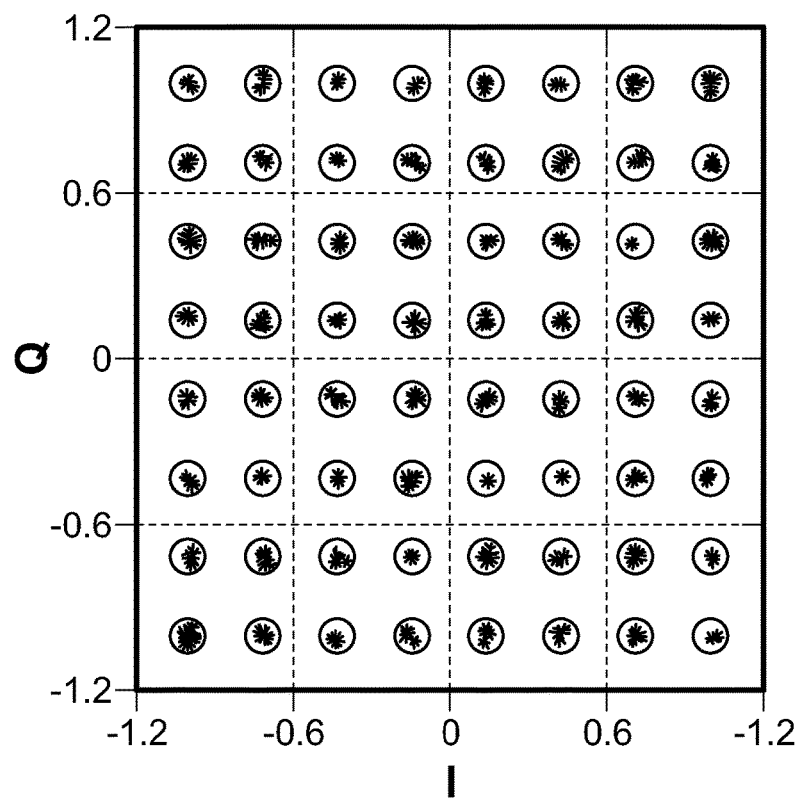
FIG. 10 is a simulated output constellation for an H-SCPA according to principles of the present disclosure.

FIG. 9 is simulated power spectral density for a 20 MHz, 64 QAM OFDM signal for an H-SCPA according to principles of the present disclosure. FIG. 10 is a simulated output constellation for an H-SCPA according to principles of the present disclosure. To characterize the dynamic performance of the H-SCPA, a 64-QAM, OFDM signal with 20 MHz channel bandwidth was input into the H-SCPA simulation. The spectrum 902 of FIG. 9 shows good margin to the spectral mask 904, while the constellation of FIG. 10 shows an error vector magnitude (EVM) of 1.9%—root mean squared (rms), with no digital pre-distortion applied to the simulated input signal. In some examples, noise shaping from the DSM may marginally increase the close-in noise in the power spectral density (PSD) estimate. In some examples, using more MSBs or a more advanced DSM with more output levels may mitigate the increase in the close-in noise in the PSD. The H-SCPA showed an average transmit power is 17.4 dBm, with an average system efficiency of 24.9%.

As illustrated in FIGS. 5-10, the example 12b H-SCPA implanted in 65 nm CMOS according to principles of the present disclosure may reduce the traditional tradeoffs in terms of bandwidth and resolution that are typical for full DSM DACs and full Nyquist rate DACs. The example H-SCPA simulated above was designed with a resolution of 6b, but using the hybrid approach according to principles of the present disclosure, the H-SCPA realizes an output ENOB of >9b. Thus, H-SCPAs according to principles of the present disclosure may allow for DACs with higher bandwidths, higher resolutions, and/or higher linearity compared to existing DACs.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present apparatuses and methods should not be construed as limiting the appended claims to any particular embodiment or group of embodiments. Thus, while the present apparatuses and methods have been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A switched capacitor power amplifier (SCPA) comprising:
   a first sub-array of storage elements configured to be selectively coupled to a ground or a voltage source, based at least in part, on a Nyquist-rate signal corresponding to most significant bits (MSB) of an input signal, wherein the first sub-array outputs a first voltage; and
   a second sub-array of storage elements configured to be selectively coupled to the ground or the voltage source, based at least in part, on a delta sigma modulated (DSM) signal corresponding to least significant bits (LSB) of the input signal, wherein the second sub=array outputs a second voltage,
   wherein the first voltage and the second voltage are combined to generate an output voltage of the SCPA.

2. The SCPA of claim 1, wherein the first sub-array is a unary array.

3. The SCPA of claim 1, wherein the second sub-array is a binary array.

4. The SCPA of claim 3, wherein the binary array is a C-2C array.

5. The SCPA of claim 1, wherein a bandwidth of the SCPA is based, at least in part, on a segmentation ratio of the MSB and the LSB.

6. The SCPA of claim 1, wherein the Nyquist-rate signal is a unary encoded signal.

7. An apparatus comprising:
   an encoder configured to encode a first portion of a signal and output an encoded signal based on the first portion of the signal;
   an interpolator configured to oversample a second portion of the signal and output an interpolated signal;
   a delta sigma modulator (DSM) configured to receive the interpolated signal and generate a DSM signal based on the interpolated signal; and
   a switched capacitor power amplifier (SCPA) comprising:
   a first sub-array of storage elements configured to be selectively coupled to a ground or a voltage source based on a first selection signal to output a first voltage;
   a second sub-array of storage elements configured to be selectively coupled to the ground or the voltage source based on a second selection signal to output a second voltage; and
   a selection circuit configured to:
   receive the encoded signal and output the first selection signal based, at least in part, on the encoded signal; and
   receive the DSM signal and output the second selection signal based, at least in part, on the DSM signal,
   wherein the SCPA is configured to combine the first voltage and the second voltage to generate an output signal.

8. The apparatus of claim 7, wherein the encoder is a unary encoder.

9. The apparatus of claim 7, wherein the interpolator is a half-band filter.

10. The apparatus of claim 7, wherein the DSM is a first-order DSM.

11. The apparatus of claim 7, further comprising a retiming circuit configured to retime the first portion of the signal prior to the encoder generating the encoded signal.

12. The apparatus of claim 7, further comprising a phase modulator configured to extract phase information from the signal and provide a clock signal based on the phase information to the selection circuit.

13. The apparatus of claim 7, further comprising a digital pattern generator configured to extract amplitude information from the signal and provide the first portion of the signal and the second portion of the signal to the encoder and the interpolator, respectively.

14. The apparatus of claim 7, further comprising a matching network configured to receive the output signal from the SCPA.

15. The apparatus of claim 14, further comprising an antenna configured to receive the output signal from the matching network and transmit the output signal.

16. The apparatus of claim 7, wherein the first sub-array is a unary capacitor array and the second sub-array is a binary capacitor array.

17. The apparatus of claim 7, wherein the SCPA is implemented in a complementary metal oxide semiconductor (CMOS) process.

18. A method comprising:
   receiving a most significant bit (MSB) portion of a digital signal;
   receiving a least significant bit (LSB) portion of the digital signal;
   encoding the MSB portion of the signal to generate an encoded signal;
   delta sigma modulating the LSB portion to generate a delta sigma modulated (DSM) signal;
   selectively coupling to a voltage source capacitors of a unary sub-array of a switched capacitor power amplifier (SCPA) based, at least in part, on the encoded signal to generate a first output;
   selectively coupling to the voltage source capacitors of a binary sub-array of the SCPA based, at least in part, on the DSM signal to generate a second output; and
   combining the first output and the second output to generate an analog signal corresponding to the digital signal.

19. The method of claim 18, further comprising oversampling the LSB portion prior to delta sigma modulating the LSB portion.

* * * * *